United States Patent
Nakabayashi et al.

(10) Patent No.: US 6,808,645 B2
(45) Date of Patent: Oct. 26, 2004

(54) SUSCEPTOR AND SURFACE PROCESSING METHOD

(75) Inventors: Tetsuya Nakabayashi, Nara (JP); Hitoshi Ujimasa, Higashiosaka (JP); Kazuyuki Zaitsu, Nabari (JP); Masafumi Kokura, Kashiba (JP)

(73) Assignee: Sharp Kabushiki Kaisha, Osaka (JP)

( * ) Notice: Subject to any disclaimer, the term of this patent is extended or adjusted under 35 U.S.C. 154(b) by 209 days.

(21) Appl. No.: 09/813,152

(22) Filed: Mar. 21, 2001

(65) Prior Publication Data

US 2002/0033381 A1 Mar. 21, 2002

(30) Foreign Application Priority Data

Mar. 21, 2000 (JP) ........................... 2000-078321
Jan. 10, 2001 (JP) ........................... 2001-002081

(51) Int. Cl.[7] .................................................. B44C 1/22
(52) U.S. Cl. ........................... 216/41; 216/42; 438/690; 438/745
(58) Field of Search ..................... 216/41, 42; 156/345, 156/657.1; 438/690, 745, 747, 750, 753; 118/715; 451/38

(56) References Cited

U.S. PATENT DOCUMENTS

| | | | | |
|---|---|---|---|---|
| 3,808,751 A | * | 5/1974 | Usui | 51/312 |
| 4,648,691 A | * | 3/1987 | Oguchi et al. | 350/338 |
| 5,254,171 A | * | 10/1993 | Hayakawa et al. | 118/723 MR |
| 5,468,344 A | * | 11/1995 | Inoue et al. | 156/345 |
| 6,368,410 B1 | * | 4/2002 | Gorczyca et al. | 118/715 |
| 6,494,960 B1 | * | 12/2002 | Macdonald et al. | 134/3 |

FOREIGN PATENT DOCUMENTS

JP   A10070099   3/1998

* cited by examiner

*Primary Examiner*—Lan Vinh
(74) *Attorney, Agent, or Firm*—Birch, Stewart, Kolasch & Birch, LLP

(57) ABSTRACT

A susceptor provided as a base of a liquid crystal substrate in a vacuum chamber of a thin film deposition apparatus is provided. The susceptor includes a susceptor main body and a stepped portion provided on the susceptor main body to support the substrate from the bottom. The stepped portion is formed of a size smaller than the substrate. By the provision of the stepped portion, conduction between a film formed at an end plane of the substrate and a film formed at the portion around the substrate can be avoided.

8 Claims, 8 Drawing Sheets

SUSCEPTOR AND SURFACE PROCESSING METHOD

BACKGROUND OF THE INVENTION

1. Field of the Invention

The present invention generally relates to susceptors, and more particularly to a susceptor provided as a base of a substrate in a chamber of a vacuum apparatus where a substrate fabrication process such as sputtering and thin film deposition is carried out. The present invention relates to the surface processing method of a subject to be processed such as the susceptor.

2. Description of the Background Art

In general, the cleaning process of a susceptor is carried out, not for each substrate deposition, but at the end of the deposition of a set of several substrates. Therefore, the film or coating attached to the susceptor will be layered during film deposition of the substrate.

Conventionally, the cleaning method of a susceptor that is carried out succeeding the film growth process is implemented along the flow of process shown in FIG. 7. First, an etching step (FIG. 7(A)) is carried out until the layered film attached on the susceptor during substrate film deposition is completely removed, followed by a pure water rinsing step (FIG. 7(B)), an ultra pure water rinsing step (FIG. 7(C)), a drying step (FIG. 7(D)), an inspection step (FIG. 7(E)), a packaging step (FIG. 7(F)) and the like, to follow the cycle of re-usage.

The sales of personal computers have increased drastically in accordance with the spread of the Internet. As to the specification of liquid crystal panels incorporated in such personal computers, more stringent requirements are implied with respect to higher luminance, higher accuracy, higher opening ratio, faster response, and lower power consumption. Furthermore, the necessity of improving the yield is essential since the cycle of a sudden drop in price has become shorter.

Particularly in order to accommodate higher accuracy and higher opening ratio, the line width of gates and source lines must be made smaller. In the process of fabricating a thin film transistor (TFT), reducing the number of particles during film deposition in the metal wiring formation apparatus such as the sputtering device is indispensable so as to suppress the disconnection ratio of lines.

The most general case of the source of generating contaminants and foreign objects is caused by the peeling or flaking off of films that have adhered on the walls in the chamber and on members and the like during film deposition. As to an anti-adherence plate used in a chamber as shown in FIG. 8, peeling off is generally reduced by applying a blasting process on the mother material of Al, SUS, and the like or applying Al spray on the surface.

However, there is a susceptor portion that cannot be accommodated by the aforementioned anti-adherence plate used in the chamber as shown in FIG. 8. The susceptor is the supporting portion for the substrate that must not conduct with the substrate and that must be superior in surface planarization and heat resistance. The susceptor is generally formed of glass that has $SiO_2$ as the main component to prevent any scratches or defects on the substrate. Therefore, no prominent means has been provided as to the surface processing from the standpoint of the possibility of inducing cracking and the like.

Since the cleaning process of a susceptor is generally not carried out for each film deposition of the substrate and is performed after the film deposition of a set of several substrates, the lamination film adhering on the susceptor became the source of generating contaminants and foreign objects that peel off to fall on the substrate during the film deposition process of the substrate.

In order to satisfy the requirements as to improving the quality and facilitate reduction of the material cost, it has become necessary to prevent the generation of contaminants caused by the peeling off film from the susceptor.

Japanese Patent Laying-Open No. 10-070099 discloses a method of cleaning a semiconductor wafer subjected to sand blasting and a semiconductor wafer cleaned by this method. The method is directed to reliably removing contaminants generated by the sand blasting process by defining the processing temperature of hydrofluoric acid used for cleaning the semiconductor wafer after the sand blast process. Furthermore, the blasting process and etching process on the semiconductor itself are also taught.

However, the method of cleaning a semiconductor subjected to sand blasting disclosed in Japanese Patent Laying-Open No. 10-070099 cannot be directly applied to the case where the susceptor is formed of glass that has $SiO_2$ as the main component since it will easily crack.

There was also the problem that the layered film adhering on the susceptor will conduct with the film grown at the end face of the substrate to cause overdischarge.

SUMMARY OF THE INVENTION

In view of the foregoing, an object of the present invention is to provide a surface processing method and cleaning method preventing generation of contaminants.

Another object of the present invention is to provide a susceptor improved so as to withstand stress of a layered film during film deposition and to prevent overdischarge caused by the laminated film adhering on the susceptor establishing conduction with the film grown at the end plane of the substrate.

According to an aspect of the present invention, a susceptor provided as a base of a substrate within a vacuum chamber of a thin film deposition apparatus includes a susceptor main unit. A stepped portion supporting the substrate from the bottom is formed on the susceptor main unit in a size smaller than the substrate.

According to another aspect of the present invention, a surface processing method includes the step of applying blasting on the surface of a susceptor that has $SiO_2$ as a component.

According to a further aspect of the present invention, the surface processing method includes the step of masking a susceptor portion forming contact with the substrate, prior to the blasting step.

According to still another aspect of the present invention, the surface processing method includes the step of high-pressure water rinsing the surface of the susceptor, prior to the blasting step.

According to a still further aspect of the present invention, the blasting step is carried out using $SiO_2$ or SiC.

According to yet a further aspect of the present invention, the surface processing method includes the step of high-pressure water rinsing the surface of the susceptor after the etching step.

A surface processing method according to yet another aspect of the present invention relates to a surface processing method of a glass jig that has $SiO_2$ as the main component, used in the neighborhood of the substrate and wafer in the semiconductor formation step, plasma display panel (PDP) formation step, plasma address liquid crystal (PALC) formation step and flat panel display (FPD) formation step.

A blasting step is applied on the surface of a subject to be processed (first step). The surface of the under-processing subject is etched (second step). The under-processing subject is cleaned by the means of (i) or (ii) below.

(i) Water rinsing at high pressure.

(ii) Rinsing with pure water and rinsing at high pressure.

A surface processing method according to yet a still further aspect of the present invention relates to a surface processing method of a thin film transistor substrate (TFT substrate) of a reflective liquid crystal panel.

The surface of the TFT substrate is subjected to blasting (first step). The surface of the TFT substrate is etched (second step). The under-processing subject is cleaned by the means of (i) or (ii) below.

(i) Water rinsing at high pressure.

(ii) Rinsing with pure water and rinsing at high pressure.

According to an additional aspect of the present invention, the surface processing method further includes the step of masking a susceptor portion that forms contact with the substrate, prior to the blasting step.

According to another aspect of the present invention, the surface processing method further includes the step of rinsing the surface of the susceptor at high pressure, prior to the blasting step.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Embodiments of the present invention will be described hereinafter with reference to the drawings. It will be understood that such description is merely exemplary, and not exclusive.

Figure 1:
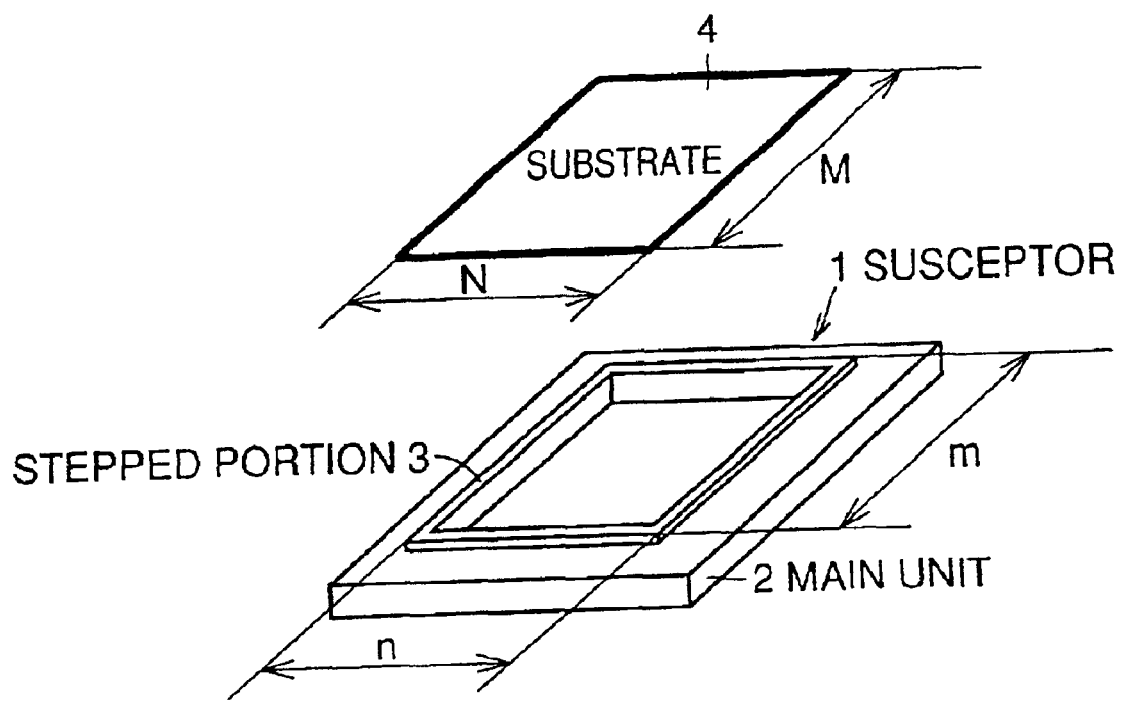
FIG. 1 is a perspective view of a substrate and susceptor of the present invention to describe the size relationship.
Figure 2A:
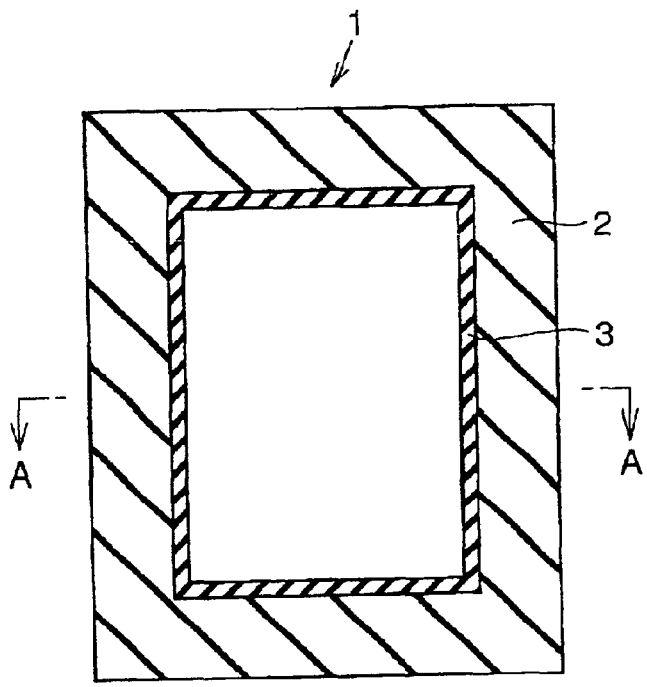
FIG. 2A is a top view of a susceptor.
Figure 2B:
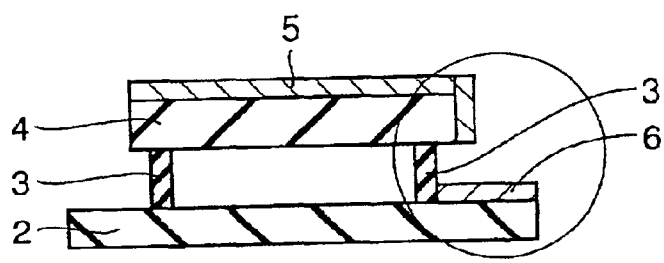
FIG. 2B is a sectional view taken along line AA of FIG. 2A.
Figure 2C:
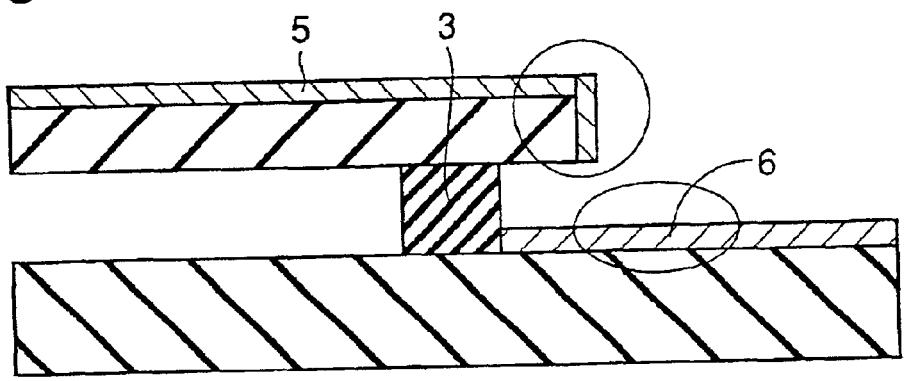
FIG. 2C is a partial enlarged view of FIG. 2B.

FIG. 1 is a perspective view showing the configuration of a susceptor 1 that becomes the base of a substrate according to the present embodiment. FIG. 2A is a top view of susceptor 1. FIG. 2B is a sectional view of susceptor 1 of FIG. 2A taken along line A—A. FIG. 2C is an enlarged view of the portion encircled in FIG. 2B.

Referring to FIG. 1, susceptor 1 includes a main unit 2 and a stepped portion 3. Stepped portion 3 is provided on main unit 2. Stepped portion 3 has a size m×n smaller than substrate 4 that has the size of M×N.

The wording "a size smaller than" implies that the dimension m and n of the stepped portion are set so that a film is not adhered on the bottom plane of the susceptor during film deposition of the substrate and also set so as to prevent warping of the substrate caused by stress to result in contact between the substrate and the surface during film deposition.

For example, when the substrate size is 400×500 mm, the difference between M and m (M−m) and the difference between N and n (N−n) is preferably 8 mm to 12 mm, further preferably approximately 10 mm. If the values of (M−m) and (N−n) are too large, the substrate will warp by the stress during film deposition to cause contact between the substrate and the surface of the susceptor, resulting in overdischarge. If the values of (M−m) and (N−n) are too small, a film will adhere, not only on the surface, but also on the bottom plane of the susceptor during film deposition of the substrate, whereby conduction will be established between the substrate and the susceptor to cause overdischarge. The height of stepped portion 3 is preferably 2 mm to 4 mm when the substrate size is 400×500 mm. It is preferable to set the height of stepped portion 3 corresponding to the warping of the substrate caused by the stress during film deposition.

By depositing substrate 4 using susceptor 1 provided with a stepped portion 3 of a size smaller than substrate 4 as shown in FIG. 1, a discrete step is provided between a film 5 at the end plane of substrate 4 and a film 6 adhering on the surface of the main unit of the susceptor. Therefore, conduction (overdischarge) between film 5 at the end plane of substrate 4 and film 6 adhering on main unit 2 (on the plane where the stepped portion is located) can be prevented.

Second Embodiment

Figure 3:
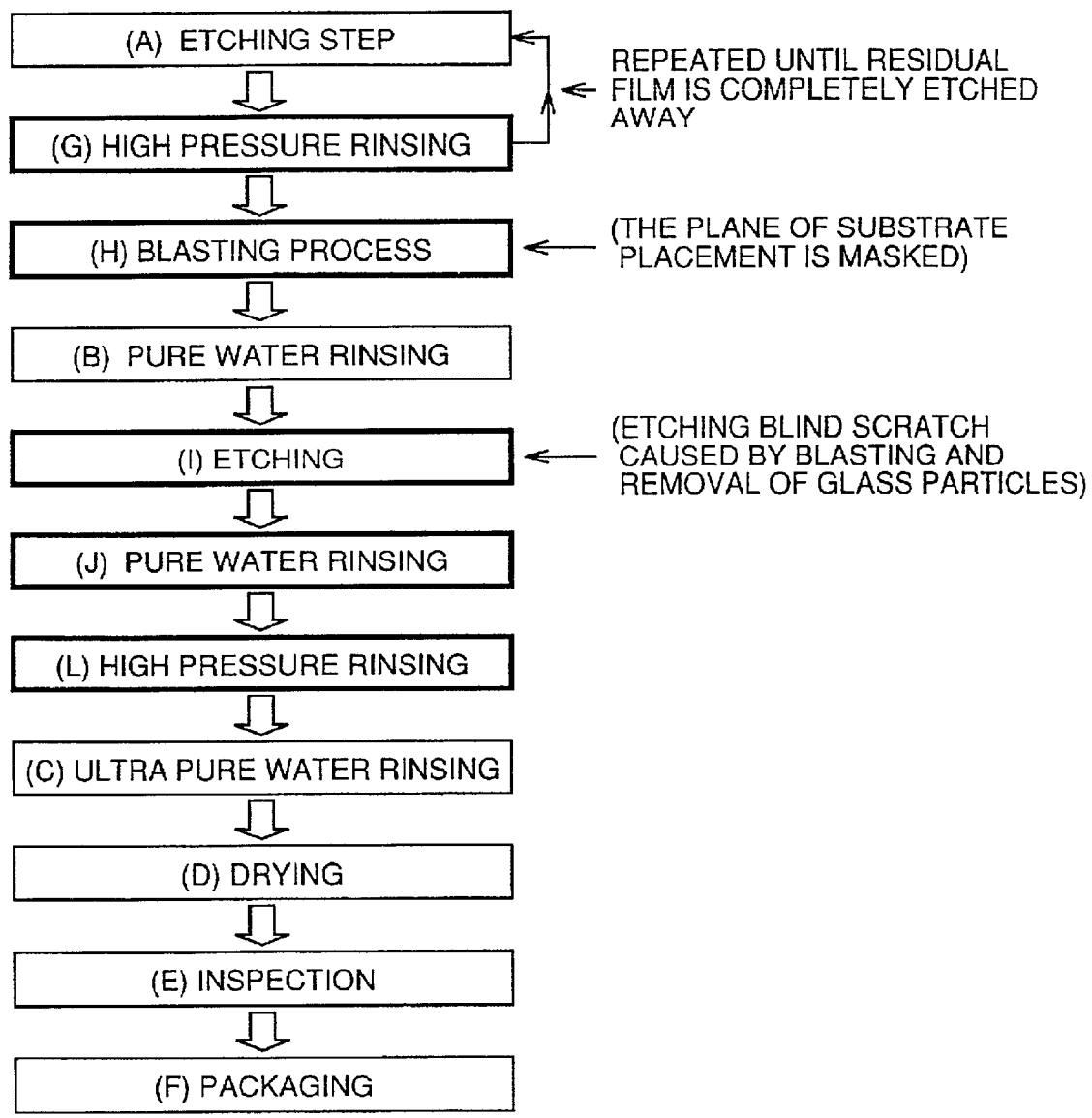
FIG. 3 shows the steps in a cleaning method of the present invention.

FIG. 3 shows the flow of a cleaning process of the present invention.

The first improvement is aimed to reduce the time consumed to complete etching by reducing the thickness of the film to be etched. After the etching step (FIG. 3(A)), high-pressure water rinsing (FIG. 3(G)) is introduced. This cycle is repeated.

By virtue of the high pressure water rinsing step, the film that is partially peeling by the etching step is removed by physical force. After removing the film that was partially peeling in the etching step (FIG. 3(A)) by physical force through the rinsing step of high pressure (FIG. 3(G)), an etching step is applied again (FIG. 3(A)) to effect the residual film processing. Accordingly, the thickness of the film to be etched is further reduced. Thus, by introducing the high pressure water rinsing step (FIG. 3(G)) between etching steps (FIG. 3(A)) and repeating this cycle, the time required for etching the film formed on the susceptor can be suppressed to less than half the time of a conventional case.

Since the residual film is removed effectively by the introduction of the high pressure rinsing step (FIG. 3(G)), the amount of etching away the mask can be reduced. This is extremely advantageous in that the material cost for etching can be reduced.

The second improvement is aimed to prevent film peeling by improving the adherence of the film attached on the surface of the susceptor. For this purpose, a blasting step (FIG. 3(H)) is introduced. It is desirable that a material similar to that of the susceptor is used for the blasting material to prevent any damage (cracking and the like) on the susceptor. SiC or $SiO_2$ has been used in the present invention.

It is to be noted that the susceptor is a member that forms contact with the substrate. Therefore, the portion of the susceptor that is brought into contact with the substrate is preferably masked during the blasting step. This will be described in detail hereinafter.

Figure 8:
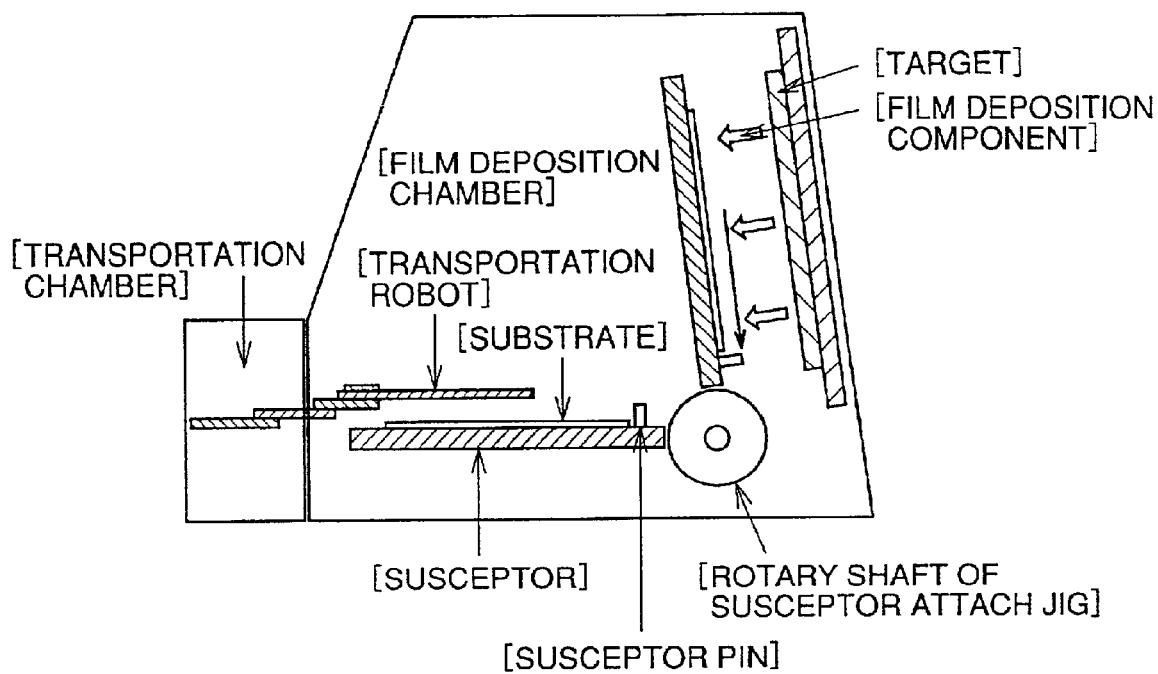
FIG. 8 shows a structure of a device to describe the shift of a substrate during film deposition according to the side deposition method.

An apparatus that holds the substrate at the side position in an upright manner to prevent the drop of particles from the target on the substrate is the mainstream of film deposition chambers. Some apparatuses are known to raise the susceptor from a horizontal status to substantially a perpendicular status to position the susceptor at its side, as shown in FIG. 8.

According to the structure of such an apparatus, the substrate, when raised upright, moves to the position supported by the susceptor pin through its own weight. If the portion of the susceptor forming contact with the substrate such as stepped portion 3 of FIG. 1 is subjected to blasting, the coefficient of friction at the portion of the susceptor forming contact with the substrate will increase to result in variation in the self-weight drop of the substrate located on the susceptor. The timing of forming contact with the susceptor pin may be deviated to induce the problem of the substrate being misplaced leftwards or rightwards. Since the position where the substrate falls evenly in the horizontal direction by its own weight, viewed from the apparatus side, is taken as the teaching point by the robot, there is a possibility of erroneous transportation, occurrence of cracking in the substrate, or the like.

Therefore, by applying a mask at the portion in contact with the substrate in the blasting step of the susceptor to avoid increase in the coefficient of friction, the occurrence of scratching towards the bottom plane of the substrate and misalignment during transportation can be prevented.

The third improvement aims to remove glass particles at the blind scratch portion generated during blasting. To this end, an etching step (FIG. 3(I)) and a cleaning step before and after this etching step are introduced. More specifically, after the blasting step (FIG. 3(H)), rinsing with pure water is carried out (FIG. 3(B)) to remove foreign objects generated during blasting. Then, an etching step (FIG. 3(I)), a rinsing step with pure water (FIG. 3(J)), a rinsing step at high pressure (FIG. 3(L)) and a rinsing step with ultra pure water (FIG. 3(C)) are carried out to remove glass particles of the blind scratch portion generated during blasting.

EXAMPLES

Examples of the present invention will be described hereinafter with reference to the drawings. It will be understood that the present invention is not limited to these examples.

Example 1

Referring to FIG. 3 of a cleaning method of the present example, a rinsing step with high pressure (FIG. 3(G)) was introduced after the etching step (FIG. 3(A)). The steps of A and G of FIG. 3 were repeated. It is desirable that the pressure of the high pressurized water is 50~80 $kgf/cm^2$.

By introducing this step, the time required for etching that was approximately 8 hours in a conventional case was reduced to three to four hours, which is half the conventional time.

Since the residual film can be removed effectively by the introduction of rinsing at high pressure, the amount of mask to be etched away can be reduced to result in lowering the material cost for etching. Therefore, this method is extremely advantageous.

For the purpose of improving the adherence of the film attaching portion (for example, main unit 2 of FIG. 2A), blasting was applied (FIG. 3(H)) using a blast material such as $SiO_2$ and SiC. Dry blasting and wet blasting are known as the blasting method. However, wet blasting is desirable taking into account the problem of cracking since the subject of blasting is a susceptor formed of glass that has $SiO_2$ as the main component such as quartz or Pyrex. In the present example, the diameter of the blast material employed in wet blasting was 50~90 µm. The blasting step (FIG. 3(H)) was carried out at the pressure of 3~5 $kgf/cm^2$.

In the blasting step (FIG. 3(H)), it is preferable to mask the plane that forms contact with the substrate to avoid increase of the coefficient of friction. It is particularly preferable to mask stepped portion 3 as shown in FIG. 1 that is the portion that forms contact with the substrate in the blast step of susceptor 1.

Thus, a susceptor can be produced that has the two features, i.e., a plane that serves to enhance the adherence to prevent film peeling (for example, main unit 2 of FIG. 2) and a plane prevented in the increase of the coefficient of friction to suppress erroneous transportation (for example, stepped portion 3 of FIG. 2). Therefore, this method is extremely advantageous.

Then, the step of rinsing with pure water (FIG. 3(B)) was carried out to remove foreign objects generated during blasting. Next, the etching step (FIG. 3(I)) was carried out.

In the subsequent etching step, hydrofluoric acid was used. Etching was effected at ordinary temperature for thirty minutes. Additionally, a sample product that was etched for 15 minutes was assessed, and confirmed that there is no problem. However, a product subjected to etching for 30 minutes was used taking into consideration the margin. It is expected that the time required for etching can be reduced by increasing the temperature and the concentration of the liquid. However, this issue was not particularly sought in the present example.

The etching step was followed by the step of rinsing with pure water (FIG. 3(J)) and rinsing with ultra pure water (FIG. 3(C)). Since the foreign objects remaining after the etching step cannot be removed sufficiently by just these steps, a high pressure water rinsing step (FIG. 3(L)) was introduced between these two rinsing steps.

The pressure of the high pressurized water was 50~80 $kgf/cm^2$. By applying physical force, foreign objects can be removed effectively. Then, a rinsing step with ultra pure water (FIG. 3(C)) which is the finishing rinsing step was carried out (resistivity: at least 15.0 MΩ/cm; TOC (total organic carbon): 50 ppb at most), followed by the process of drying (FIG. 3(D)), inspection (FIG. 3(E)), and packaging (FIG. 3(F)).

By introducing the cleaning flow of the present invention, the time required for etching can be reduced. By virtue of the blasting process, the adherence of the film attached on the susceptor can be improved to prevent generation of contaminants. Furthermore, by introducing the etching process and rinsing process after the blasting process, the generation of contaminants of glass particles at the blind scratch portion can be prevented. Also, the ratio of acceptable products can be improved.

Example 2

A susceptor subjected to the surface processing method of the present invention and a susceptor of the conventional type were compared in practice.

First, assessment was made of the ratio of unacceptable products for liquid crystal panel production using a susceptor introducing only the blasting step and a susceptor of the current type.

The samples for assessment were placed in a gate line formation processing machine (samples of the comparative example and samples of the present invention were placed in respective chambers). Assessment was made based on the occurrence as to the ratio of disconnection and ratio of short-circuiting for the line of products processed at respective chambers. Here, the ratio of the samples of the present invention will be referenced to the ratio of occurrence of the samples of the comparative examples as 1.

As to the susceptor subjected to only blasting, the ratio of disconnection was 0.5 and the ratio of short-circuiting was 1.88 where the ratio of disconnection and ratio of short-circuiting of the comparative example sample were respectively 1. In the surface observation after usage, the defect of film peeling was clearly eliminated. However, it was identified that there were defects in the micro level.

Figure 4:
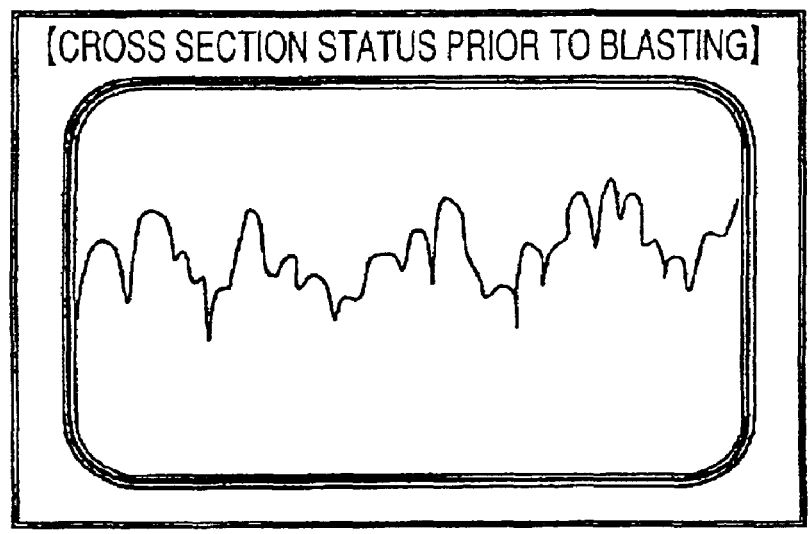
FIG. 4 shows the cross section status and surface status of a susceptor prior to a blasting step.
Figure 4:
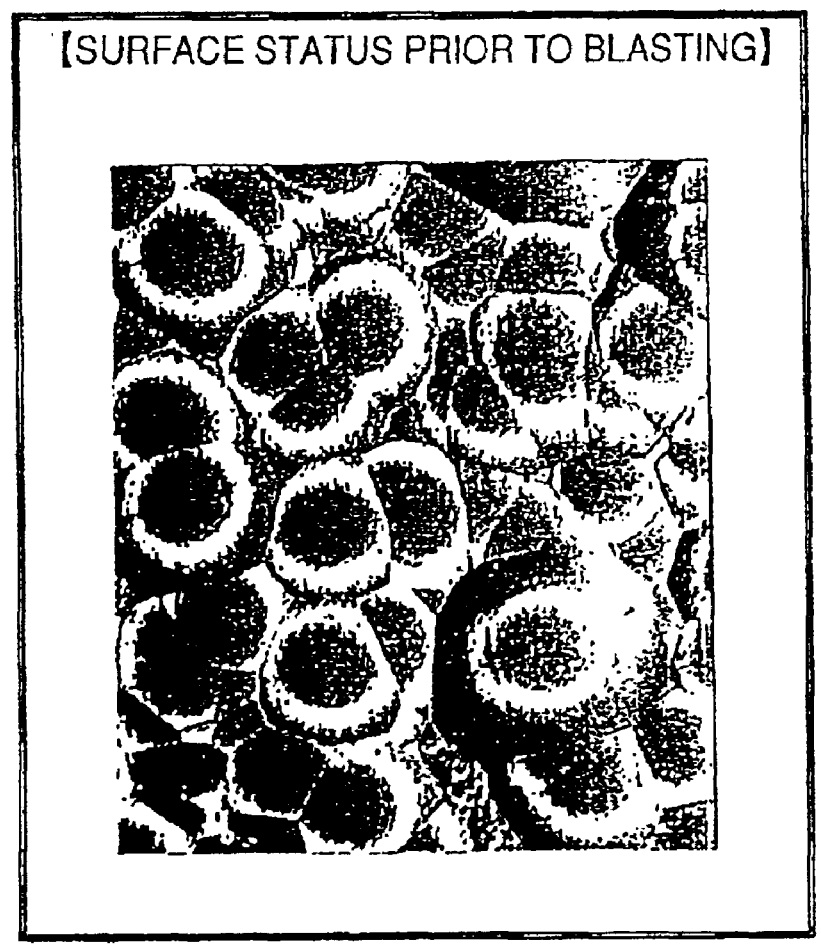
Figure 5:
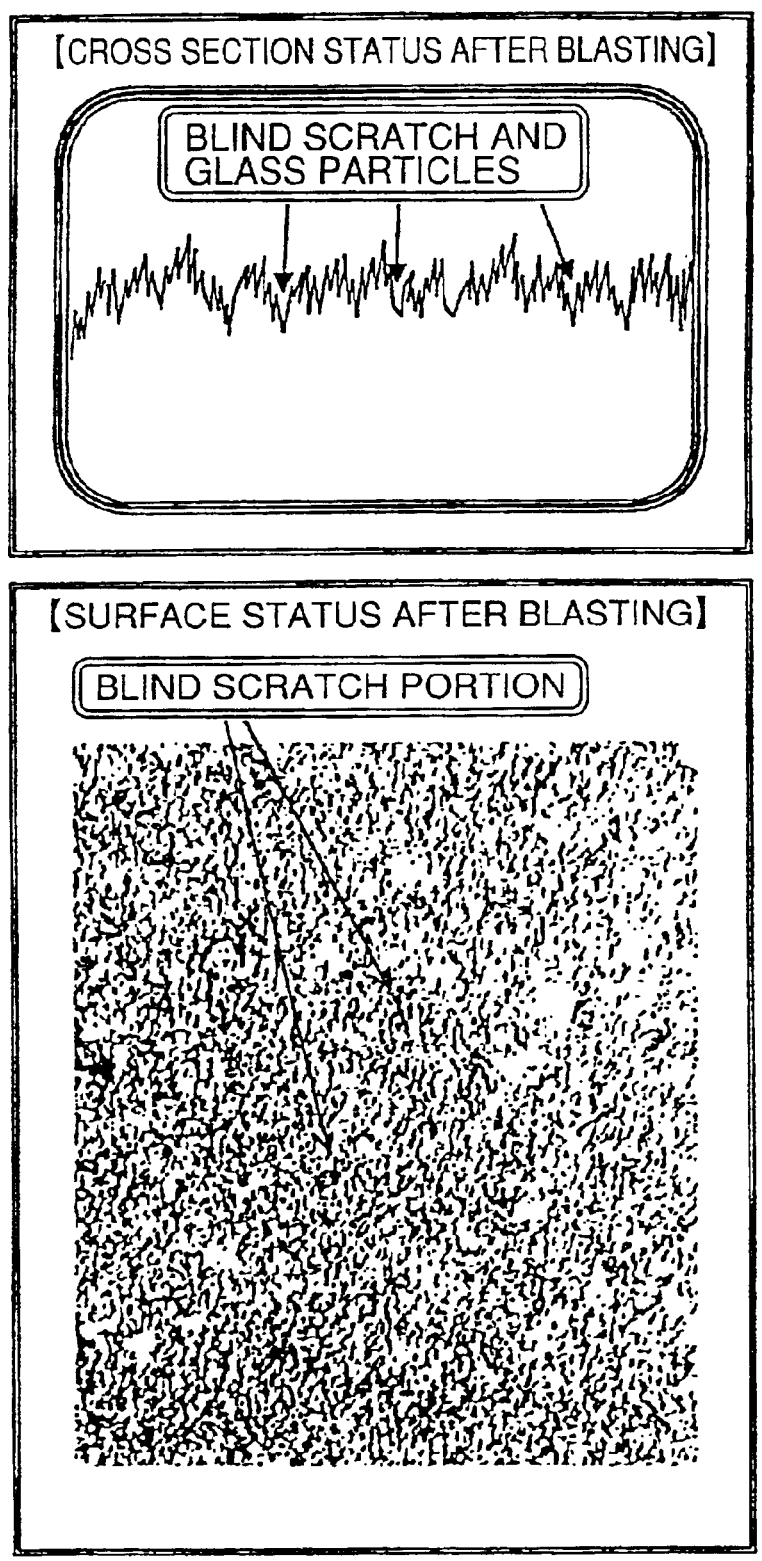
FIG. 5 shows the cross section status and surface status of the susceptor after the blasting step.
Figure 6:
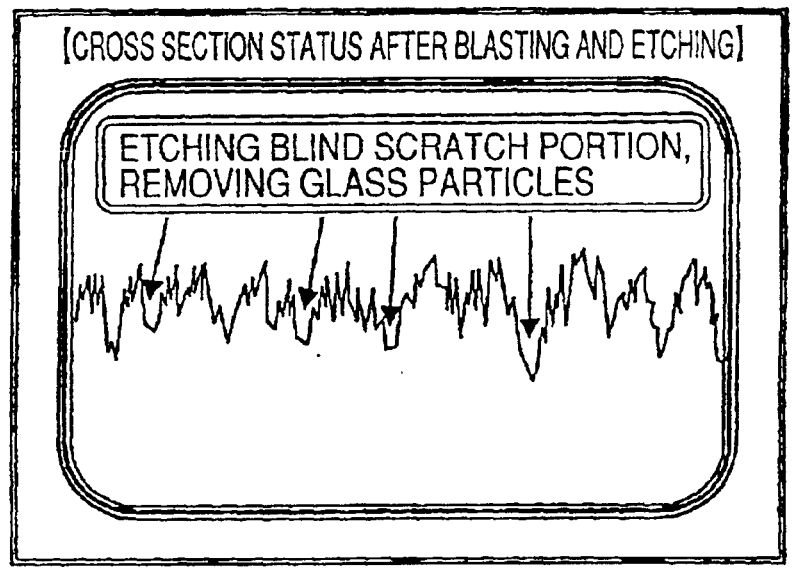
FIG. 6 shows the cross sectional status and surface status after the blasting and etching steps.
Figure 6:
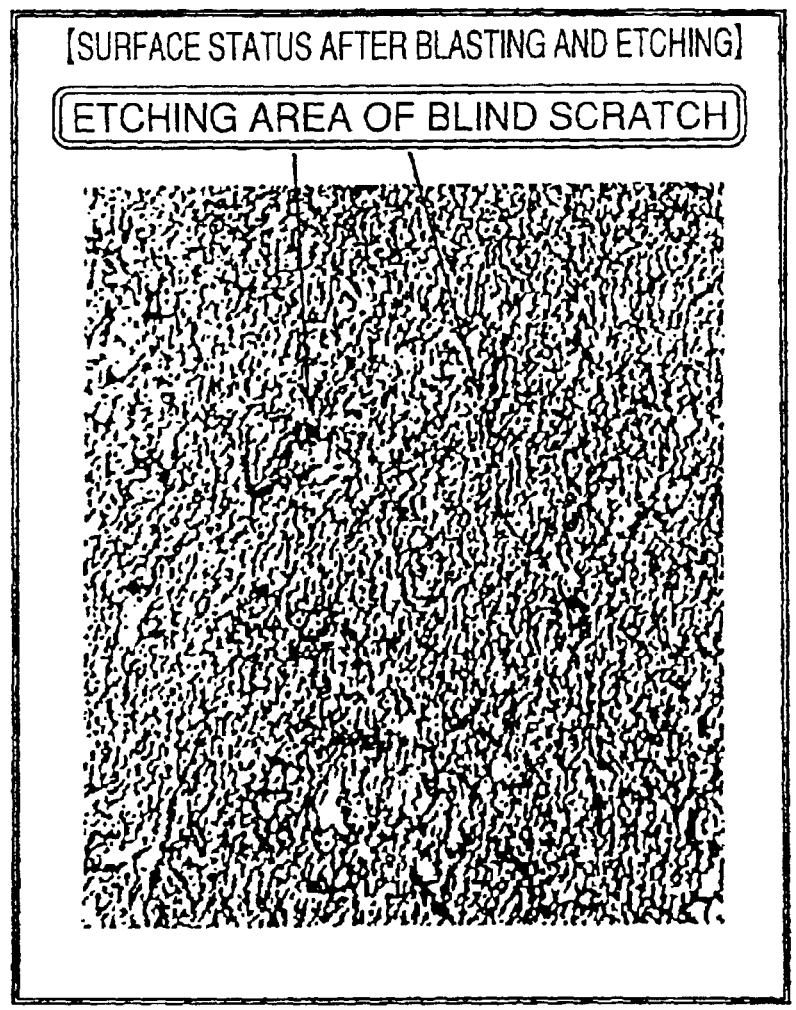
Figure 7:
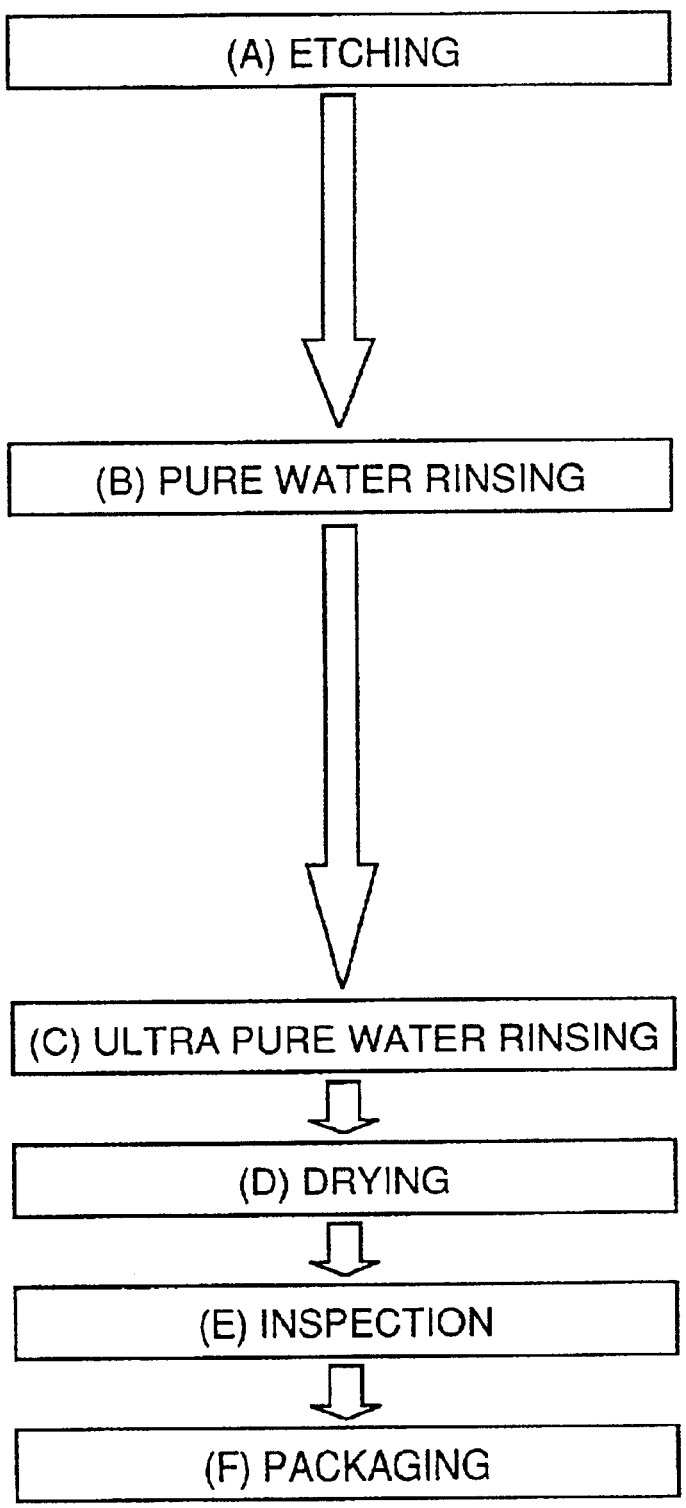
FIG. 7 shows a step of a conventional cleaning method.

FIG. 4 shows the cross section status and surface status of a susceptor prior to a blasting step. FIG. 5 shows the cross sectional status and surface status of the susceptor after a blasting step. FIG. 6 shows the cross sectional status and surface status of a susceptor after the blasting process and etching process of FIG. 6.

As a result of observing the surface with an optical microscope, the blasting process renders the surface with fine asperity. However, the entrance of a portion that seems to be a blind scratch was located at the surface, forming a groove.

The second assessment was made based on the comparison of the ratio of unacceptable products using a susceptor subjected to etching (FIG. 3(I)) after a blasting process (FIG. 3(H)) and a susceptor of the comparative example.

In the second assessment, the samples were placed in a source line formation processing machine and picture element electrode formation processing machine that exhibit a higher ratio of unacceptable products, instead of the gate line processing machine used in the first assessment. The ratio of disconnection was compared. As to the number of disconnections in the previous first gate line formation processing machine, the number of occurrence for the sample of the present invention was only one point and the number of occurrence for the sample of the comparative example was only two points with respect to a certain parameter. Accordingly, the advantageous effect of the present invention cannot be made clear. Furthermore, as a result of analyzing the defect of short-circuiting, those of another mode were mixed therein. It could not be clearly identified whether this was caused by the susceptor or not.

As to the ratio of disconnection in the source line formation process machine, the product corresponding to the susceptor subjected to the blasting and etching processes of the present invention exhibited a value of 0.56 with respect to the sample of the comparative example exhibiting the value of 1. With the picture element electrode formation process machine, the ratio of disconnection was reduced to 0.53 with respect to 1 of the sample of the comparative example. It became apparent that the present invention is advantageous in reducing the ratio of disconnection.

Upon observing the surface with an optical microscope, the blind scratch portion that was partly seen at the surface by the blasting step of FIG. 5 was altered by the etching step. The groove portion as shown in FIG. 6 could be clearly observed.

It was confirmed that the surface status after the blasting and etching process of FIG. 6 is sufficient for the range of normal usage (the repeated rinsing cycle after usage) since the average reduced amount per each process according to the repeated blasting process was approximately 0.4 $\mu$m.

It will be understood that the present invention is not limited to the above examples. For example, the present invention is not limited to the above-described example as to the configuration and surface processing method of a susceptor that is the jig within a vacuum apparatus used for thin film formation in the process of liquid crystal panel production. The configuration and surface processing method of the present invention is also applicable to the process applied to a jig used in the neighborhood of the substrate and wafer (work) in other semiconductor formation processes, PDP, PALC, FPD processes and the like.

There are some processes also applicable to the underlying process of the glass itself. More particularly, the process is applicable to the substrate for a reflective type display. If the surface processing method of the present invention is used for the general transmission type display, the transmittance of the glass itself will become lower to reduce the luminance. Since the surface of the substrate is not even, light will be scattered to cause light leakage in the display of black.

However, a reflective type display does not use transmitted light by means of back light. By applying the surface processing method of the present invention in the underlying process of the glass surface for a reflective type display, adherence of the thin film in each film deposition step can be improved, which in turn improves the ratio of acceptable products.

According to the present invention, provision of a stepped portion at the surface of the susceptor allows overdischarge to be prevented (feature 1). The application of blasting and etching ensures the adherence to withstand the layered film effectively (feature 2), as well as to reduce particles such as glass particles from the blind scratch (feature 3).

The masking treatment during the blasting process allows reduction of scratches at the bottom plane of the substrate and transportation error by preventing increase of the coefficient of friction at the substrate contact surface (feature 4). By carrying out rinsing with high pressure at the same time, reduction of the amount due to shorter etching time can be achieved (feature 5).

The usage of a susceptor according to the present invention allows extension of the O·H cycle (feature 6) corresponding to the rate-determined film peeling (feature 6), improvement of the ratio of acceptable products (feature 7), and reduction of the cost by improvement of the operating ratio of the apparatus (feature 8).

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A surface processing method comprising the steps of:
   masking a portion of a susceptor (1) forming contact with a substrate (4),
   applying a blasting process on said surface of a susceptor (1) that has $SiO_2$ as a main component, and
   etching the surface of said susceptor; and
   wherein said susceptor includes:

a susceptor main body (2), and a stepped portion (3) provided on said susceptor main body (2) to support said substrate (4) from the bottom, having a size smaller than said substrate (4), said stepped portion (3) being masked in said masking step, wherein conduction at an end plane of the substrate (4) and the main body (2) can be prevented.

2. The surface processing method according to claim 1, further comprising the step of high pressure rinsing of the surface of said susceptor (1), prior to said step of blasting.

3. The surface processing method according to claim 1, wherein said step of blasting is carried out using $SiO_2$ or SiC.

4. The surface processing method according to claim 2, further comprising the step of high pressure rinsing the surface of said susceptor (1) after said etching.

5. A surface processing method of a glass jig that has $SiO_2$ as a main component, used in a neighborhood of a substrate and a wafer in a semiconductor formation process, a plasma display panel formation process, a plasma address liquid crystal formation process, and flat panel display formation process, comprising:

a first step of applying a blasting process on a surface of a subject to be processed, a second step of etching the surface of said subject to be processed, and a third step of cleaning said subject to be processed with one of means of:

(i) rinsing at high pressure, (ii) rinsing with pure water and rinsing at high pressure;

wherein the method further comprises a step of masking a portion of a susceptor (1) forming contact with said substrate (4), prior to said first step; and wherein said susceptor includes:

a susceptor main body (2), and a stepped portion (3) provided on said susceptor main body (2) to support said substrate (4) from the bottom, having a size smaller than said substrate (4), said stepped portion (3) being masked in said masking step, wherein conduction at an end plane of the substrate (4) and the main body (2) can be prevented.

6. The surface processing method according to claim 5, further comprising the step of rinsing the surface of said susceptor (1) at high pressure, prior to said step of blasting.

7. A surface processing method comprising the steps of:

applying a blasting process on a surface of a susceptor (1) that has $SiO_2$ as a main component, and etching the surface of said susceptor;

wherein the method further comprises another etching step being different from the first recited etching step and a step of high pressure rinsing the surface of said susceptor (1), and wherein prior to said step of blasting said another etching step and said high pressure rinsing step are repeated.

8. A surface processing method of a glass jig that has $SiO_2$ as a main component, used in a neighborhood of a substrate and a wafer in a semiconductor formation process, a plasma display panel formation process, a plasma address liquid crystal formation process, and flat panel display formation process, comprising:

a first step of applying a blasting process on a surface of a subject to be processed, a second step of etching the surface of said subject to be processed, and a third step of cleaning said subject to be processed with one of means of:

(i) rinsing at high pressure, (ii) rinsing with pure water and rinsing at high pressure;

wherein the method further comprises another etching step being different from said first recited etching step and a step of high pressure rinsing the surface of said susceptor (1), and wherein prior to said step of blasting said another etching step and said high pressure rinsing step are repeated.

* * * * *